United States Patent
Yuan et al.

(10) Patent No.: US 8,569,122 B2
(45) Date of Patent: Oct. 29, 2013

(54) MANUFACTURING METHOD FOR LTPS TFT ARRAY SUBSTRATE

(75) Inventors: Guangcai Yuan, Beijing (CN); Gang Wang, Beijing (CN)

(73) Assignee: BOE Technology Group., Ltd., Beijing (CN)

( * ) Notice: Subject to any disclaimer, the term of this patent is extended or adjusted under 35 U.S.C. 154(b) by 0 days.

(21) Appl. No.: 13/338,450

(22) Filed: Dec. 28, 2011

(65) Prior Publication Data
US 2012/0171822 A1    Jul. 5, 2012

(30) Foreign Application Priority Data
Dec. 29, 2010    (CN) .......................... 2010 1 0612965

(51) Int. Cl.
*H01L 21/00* (2006.01)
(52) U.S. Cl.
USPC ................................... 438/163; 257/E29.151
(58) Field of Classification Search
None
See application file for complete search history.

(56) References Cited

U.S. PATENT DOCUMENTS

| | | | |
|---|---|---|---|
| 7,176,074 B1 * | 2/2007 | Shiau et al. | 438/164 |
| 2006/0290828 A1 | 12/2006 | Hwang et al. | |
| 2007/0205422 A1 * | 9/2007 | Ahn et al. | 257/83 |
| 2009/0278131 A1 | 11/2009 | Kwon et al. | |
| 2011/0062433 A1 * | 3/2011 | Yamazaki | 257/43 |
| 2012/0001190 A1 * | 1/2012 | Okabe et al. | 257/66 |

FOREIGN PATENT DOCUMENTS

| | | |
|---|---|---|
| CN | 1897299 A | 1/2007 |
| CN | 101577283 A | 11/2009 |
| JP | 2000-077191 A | 3/2000 |

OTHER PUBLICATIONS

First Chinese Office Action dated Jul. 2, 2013 Appln. No. 2010106129658.

\* cited by examiner

*Primary Examiner* — Wael Fahmy
*Assistant Examiner* — Pamela E Perkins
(74) *Attorney, Agent, or Firm* — Ladas & Parry LLP

(57) ABSTRACT

A manufacturing method for a low temperature polysilicon (LTPS) thin film transistor (TFT) array substrate, comprising: forming a polysilicon layer on a substrate; forming a gate insulating layer on the polysilicon layer; forming a gate metal layer on the gate insulating layer; and patterning the gate metal layer, the gate insulating layer and the polysilicon layer by using a half tone mask (HTM) or a gray tone mask (GTM) so as to obtain a gate electrode and a polysilicon semiconductor pattern in a single mask process, a central part of the polysilicon semiconductor pattern is covered by the gate electrode, and the polysilicon semiconductor pattern has two parts, which are not covered by the gate electrode at two sides of the gate electrode, for forming a source region and a drain region.

13 Claims, 8 Drawing Sheets

MANUFACTURING METHOD FOR LTPS TFT ARRAY SUBSTRATE

BACKGROUND

Embodiments of the disclosed technology relate to a manufacturing method for a low temperature polysilicon thin film transistor (TFT) array substrate.

Low temperature polysilicon (LTPS) technology is initially developed to decrease power consumption of display panels of notebook computers and make the notebook computers become thinner and more light-weighted. The LTPS technology came into trial stage in about 90's of $20^{th}$ century. The new generation of organic light emitting diode (OLED) display panel developed based on LTPS has also come into practical usage, whose utmost advantage lies in ultra-thinness, light weight, low power consumption and self-illumination. Thus, a brighter color and a clearer image can be presented.

Hereinafter, a manufacturing method for a polysilicon TFT array substrate in the related arts is described by referring to FIGS. 1A-1F.

The procedure of the manufacturing method for the polysilicon TFT array substrate is as follows, and FIGS. 1A-1F are sectional views of the polysilicon TFT array substrate during various manufacturing stages thereof.

Step S101, forming a polysilicon layer.

As shown in FIG. 1A, a buffer layer 12 of a silicon oxide (e.g., $SiO_2$) film is formed on a whole surface of an insulating substrate 11 by a plasma enhanced chemical vapor deposition (PECVD) method. Thereafter, an amorphous silicon (a-Si) layer is formed on the whole surface of the buffer layer 12 by using a PECVD method or the like, after which a polysilicon layer 22 is finally formed by crystallizing the a-Si using an excimer laser annealing (ELA) process, a solid phase crystallizing (SPC) process or the like.

Step S102, forming a gate electrode.

As shown in FIG. 1B, the polysilicon layer is patterned to form a semiconductor layer 13, after which inorganic material $SiO_2$ is deposited on the whole surface of the semiconductor layer 13 to form a gate insulating layer 14. Next, a layer of low resistivity metal is deposited on the gate insulating layer 14 and is patterned to form a gate line with a gate electrode 15a.

Step S103, implanting dopant ions into the polysilicon layer.

As shown in FIG. 1C, n-type dopant ions of high concentration are doped into the semiconductor layer 13 by using the gate electrode 15a as a mask to form a source region 13a and a drain region 13c. Here, due to the presence of the gate electrode 15a, the dopant ions are not doped into the semiconductor layer between the source region 13a and the drain region 13c, which becomes a channel 13b.

Step S104, forming an interlayer dielectric layer.

As shown in FIG. 1D, an inorganic material of silicon oxide (e.g., $SiO_2$) is deposited on the whole surface of the substrate formed with the gate electrode 15a by a chemical vapor deposition (CVD) method so as to form an interlayer dielectric layer 16.

Step S105, activating the polysilicon.

The semiconductor layer 13 is activated by performing a rapid thermal annealing (RTA), a laser beam irradiating using an excimer laser, or a furnace annealing on the surface of the semiconductor layer 13.

Step S106, forming source/drain electrodes.

After the activation process is completed in step S105, as shown in FIG. 1E, the gate insulating layer 14 and the interlayer dielectric layer 16 is etched to expose the source and drain regions 13a and 13c so as to form first contact holes 20a and 20b. A dry etching is typically performed to etch the gate insulating layer 14 and the interlayer dielectric layer 16. Next, as shown in FIG. 1F, a layer of low resistivity metal is deposited on the interlayer dielectric layer 16, which is patterned to form a data line perpendicular to the gate line and having a source electrode 17a and a drain electrode 17b. The source and drain electrodes 17a and 17b contact with the source and drain regions 13a and 13b, respectively.

Step S107, hydrogenating the polysilicon.

An inorganic material such as silicon nitride ($SiN_x$) is deposited by using a CVD method on the whole surface of the substrate formed with the source and drain electrodes 17a and 17b to form a passivation layer 18. Further, the substrate is heated up to an endurable temperature range thereof so as to make the hydrogen atoms contained in the passivation layer 18 diffuse into the semiconductor layer.

Step S108, forming a pixel electrode.

The passivation layer 18 is selectively removed to form a second contact hole 40 to expose the drain electrode 17b. Further, a pixel electrode 37 is formed in a pixel region in a manner such that the pixel electrode 37 contacts with the drain electrode 17b through the second contact hole 40.

In the conventional manufacturing method for the polysilicon TFT array substrate, at least six mask processes are needed in total to form the semiconductor layer, the gate line layer, the first contact hole, the data line layer, the second contact hole and the pixel electrode. The increasing number for the mask processes results in a complicated procedure, which increases the processing time and cost accordingly.

SUMMARY

An embodiment of the disclosed technology provides a manufacturing method for a low temperature polysilicon (LTPS) thin film transistor (TFT) array substrate, comprising: forming a polysilicon layer on a substrate; forming a gate insulating layer on the polysilicon layer; forming a gate metal layer on the gate insulating layer; and patterning the gate metal layer, the gate insulating layer and the polysilicon layer by using a half tone mask (HTM) or a gray tone mask (GTM) so as to obtain a gate electrode and a polysilicon semiconductor pattern in a single mask process, a central part of the polysilicon semiconductor pattern is covered by the gate electrode, and the polysilicon semiconductor pattern has two parts, which are not covered by the gate electrode at two sides of the gate electrode, for forming a source region and a drain region.

Further scope of applicability of the disclosed technology will become apparent from the detailed description given hereinafter. However, it should be understood that the detailed description and specific examples, while indicating preferred embodiments of the disclosed technology, are given by way of illustration only, since various changes and modifications within the spirit and scope of the disclosed technology will become apparent to those skilled in the art from the following detailed description.

BRIEF DESCRIPTION OF THE DRAWINGS

The disclosed technology will become more fully understood from the detailed description given hereinafter and the accompanying drawings which are given by way of illustration only, and thus are not limitative of the disclosed technology and wherein.

DETAILED DESCRIPTION

Embodiments of the disclosed technology now will be described more clearly and fully hereinafter with reference to the accompanying drawings, in which the embodiments of the disclosed technology are shown. Apparently, only some embodiments of the disclosed technology, but not all of embodiments, are set forth here, and the disclosed technology may be embodied in other forms. All of other embodiments made by those skilled in the art based on embodiments disclosed herein without mental work fall within the scope of the disclosed technology.

First Embodiment

The first embodiment of the disclosed technology provides a manufacturing method for a low temperature polysilicon (LTPS) TFT array substrate, which is described by an example in which the LTPS TFT array substrate is manufactured by using a half tone mask (HTM).

Figure 1A:
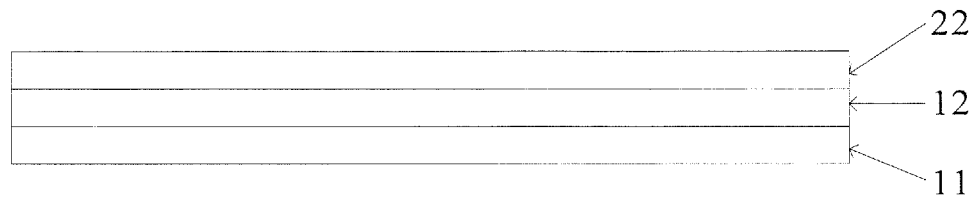
FIG. 1A is a first diagram in a manufacturing method for a polysilicon TFT array substrate in the related arts.
Figure 1B:
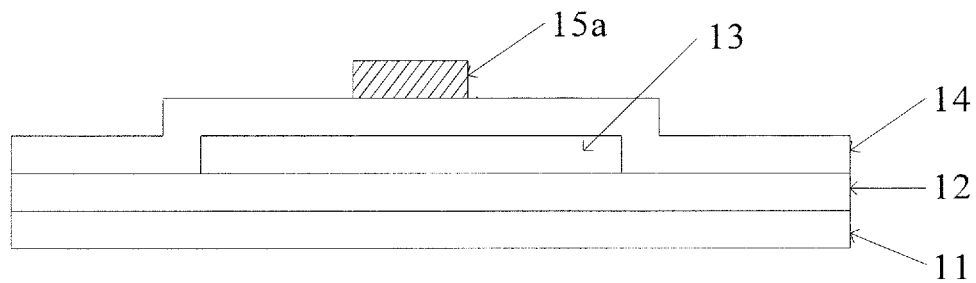
FIG. 1B is a second diagram in the manufacturing method for the polysilicon TFT array substrate in the related arts.
Figure 1C:
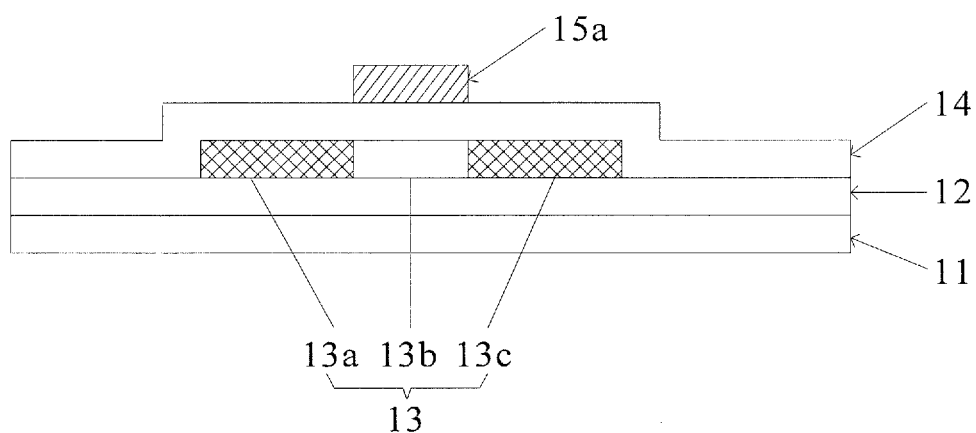
FIG. 1C is a third diagram in the manufacturing method for the polysilicon TFT array substrate in the related arts.
Figure 1D:
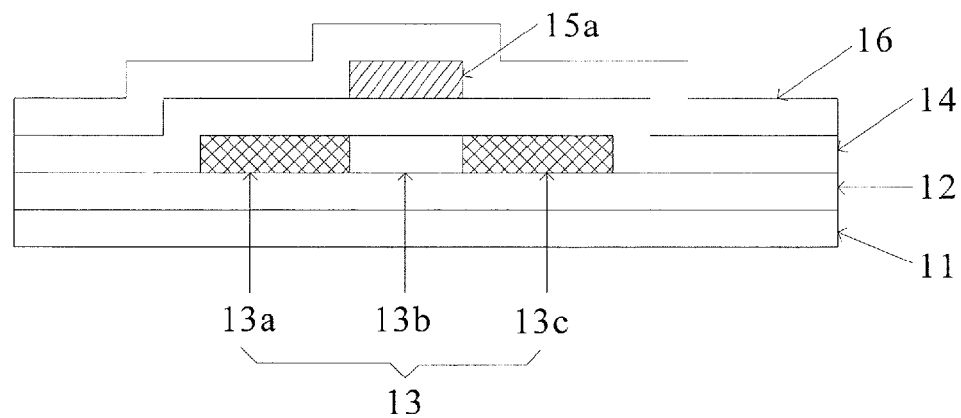
FIG. 1D is a fourth diagram in the manufacturing method for the polysilicon TFT array substrate in the related arts.
Figure 1E:
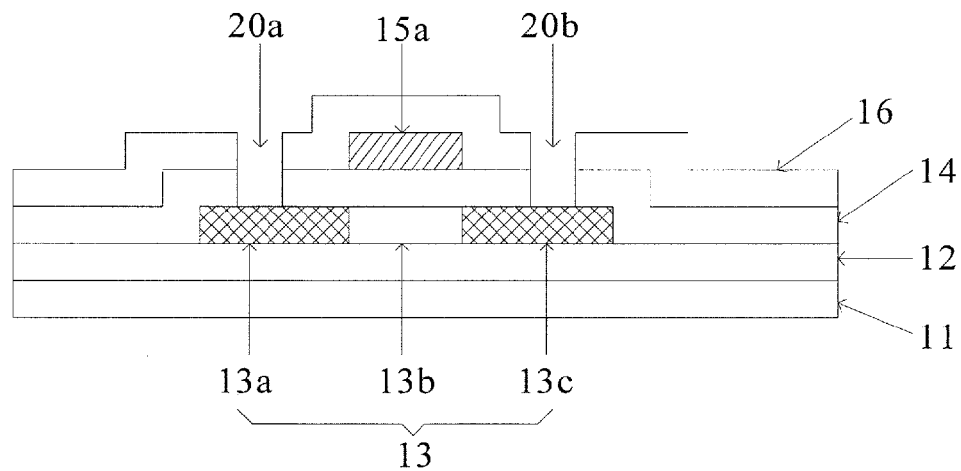
FIG. 1E is a fifth diagram in the manufacturing method for the polysilicon TFT array substrate in the related arts.
Figure 1F:
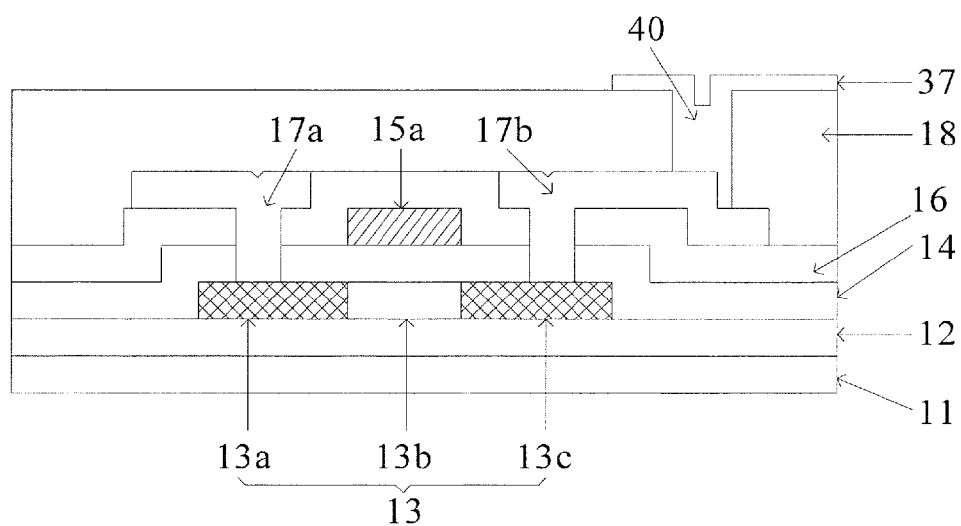
FIG. 1F is a sixth diagram in the manufacturing method for the polysilicon TFT array substrate in the related arts.
Figure 2A:
FIG. 2A is a diagram illustrating exposing photoresist with a half tone mask (HTM) mask.

First, the main principle of the HTM process is explained with reference to FIG. 2A. A HTM is a mask with various regions the light transmitted through each of which has different intensities so as to expose and develop photoresist selectively. FIG. 2A shows an exposing process performed on the photoresist using a HTM plate 31. The HTM plate 31 comprises a transparent region 311, an opaque region 312 and a semi-transparent region 313. The photoresist 32 is in a state of having been exposed, where a region 321 corresponds to the transparent region 311 of the HTM plate 31, a region 322 corresponds to the opaque region 312 of the HTM plate 31, and a region 323 corresponds to a semi-transparent region 313 of the HTM plate 31. The photoresist 33 is in a state of having been developed, where a region 331 corresponds to the transparent region 311 of the HTM plate 31, a region 332 corresponds to the opaque region 312 of the HTM plate 31, and a region 333 corresponds to the semi-transparent region 313 of the HTM plate 31.

Hereinafter, a manufacturing method for a LTPS TFT array substrate using a HTM plate according to the first embodiment of the disclosed technology is described with reference to FIGS. 3A-3P.

Step S401, forming a buffer layer on a substrate.

First, a substrate such as a glass substrate is cleaned by using an initial clean process. The resulted cleanness meets a requirement where the amount of particles is equal to or less than 300 ea (particle diameter≥1 um). The glass substrate may have a thickness of 0.3 to 0.7 mm, for example. To prevent deleterious matters such as alkali ions in the glass substrate from influencing the property of later formed polysilicon layer, a buffer layer is deposited on the glass substrate by using a PECVD method, and a pre-clean process is conducted before depositing the buffer layer.

Figure 3A:
FIG. 3A is a first diagram in a manufacturing method for a polysilicon TFT array substrate according to an embodiment of the disclosed technology.

As shown in FIG. 3A, a glass substrate 51 serves as an underlayer, which is covered by a buffer layer 52. In the present embodiment, the buffer layer comprises two portions. First, a layer of $SiN_x$ film is deposited to a thickness of about 50-100 nm, which may effectively inhibit metal ions in the glass substrate from affecting the later formed polysilicon layer. A layer of $SiO_2$, which matches well with a polysilicon layer, is deposited to a thickness of about 100-150 nm on the $SiN_x$ film to prevent defects in the $SiN_x$ from affecting the crystallization of the later formed polysilicon layer. The completed buffer layer may be annealed to optimize its performance.

Step S402, forming a polysilicon layer on the buffer layer.

Figure 3B:
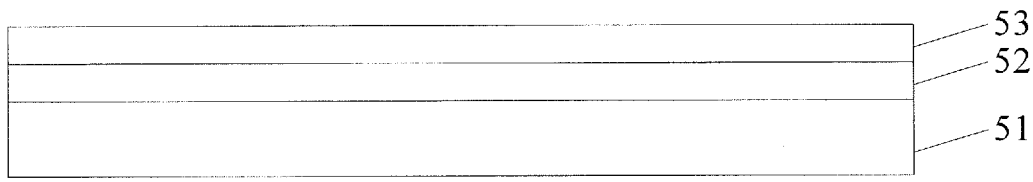
FIG. 3B is a second diagram in the manufacturing method for the polysilicon TFT array substrate according to the embodiment of the disclosed technology.

As shown in FIG. 3B, an amorphous silicon (a-Si) layer 53 is deposited to a thickness of 30-100 nm on the buffer layer 52 by using a PECVD method, after which a polysilicon layer 53 is obtained by crystallizing the a-Si.

Specifically, after the a-Si layer is deposited on the buffer layer by using a PECVD method, a dehydrogenating process is performed on the a-Si layer using a high temperature oven so as to prevent occurrence of hydrogen blasting during the later crystallizing process and decrease the defect density within the later crystallized film. After the dehydrogenating process is finished, an LTPS process is performed to crystallize the a-Si layer. Typically, a crystallizing method such as ELA, metal induced crystallization (MIC), SPC or the like is employed to crystallize the a-Si layer. After the crystallizing process, a surface treatment is performed to the resulted polysilicon layer using DHF (Hydroxyl-Oxo-Succinic Acid Dimethyl Ester, having a purity of 1-20%) or diluted HF solution, by which the surface roughness of the polysilicon layer is decreased and the wrinkles or tip protrusions resulted from the crystallizing is removed, so that the polysilicon layer may contact with the later formed layers more closely and thus the device performance is enhanced.

Step S403, forming a gate insulating layer on the polysilicon layer.

Figure 3C:
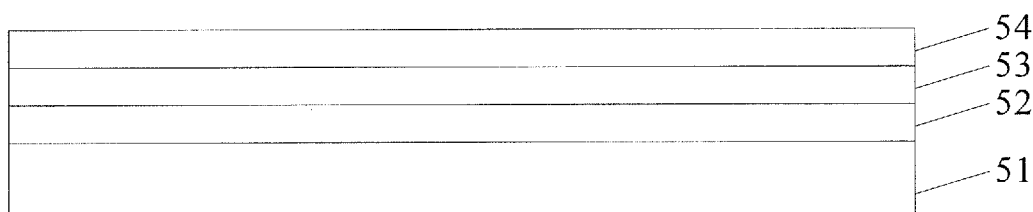
FIG. 3C is a third diagram in the manufacturing method for the polysilicon TFT array substrate according to the embodiment of the disclosed technology.

As shown in FIG. 3C, a gate insulating layer 54 is deposited on the treated polysilicon layer 53 using a PECVD method. The gate insulating layer may be a composite $SiO_2/SiN_x$ film having a thickness of (30-100 nm)/(60-150 nm).

Step S404, forming a gate metal layer on the gate insulating layer.

Figure 3D:
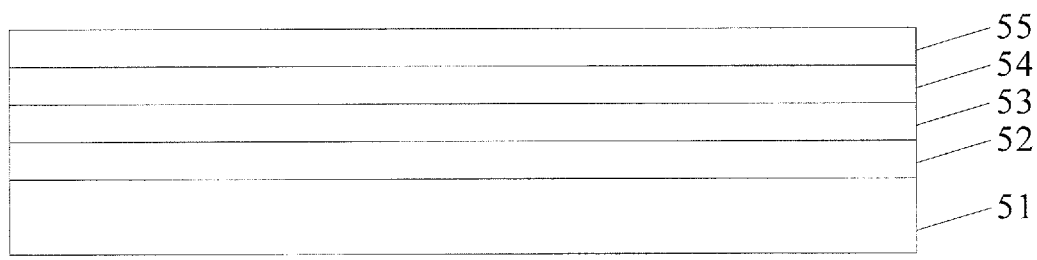
FIG. 3D is a fourth diagram in the manufacturing method for the polysilicon TFT array substrate according to the embodiment of the disclosed technology.

As shown in FIG. 3D, a gate metal layer 55 is formed to a thickness of 250-400 nm using a sputtering method on the gate insulating layer 54. The material for the gate metal layer 55 may be one selected from a group consisting of Al, Mo, composite Al/Mo, composite Nd—Al and the like.

Step S405, patterning the gate metal layer, the gate insulating layer and the polysilicon layer using a HTM plate so as to obtain a gate electrode and a polysilicon semiconductor pattern in a single patterning process (i.e., in a single mask process).

Figure 3E:
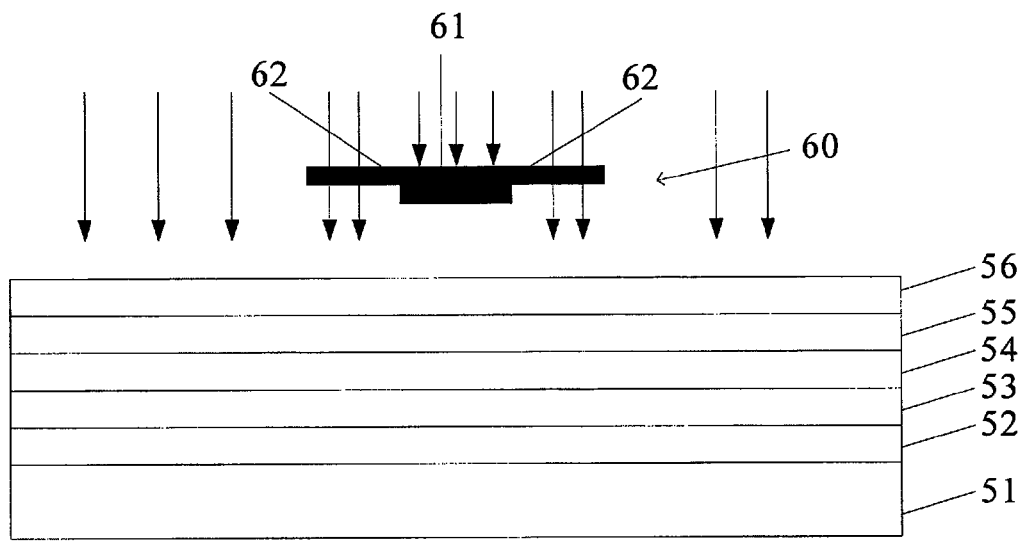
FIG. 3E is a fifth diagram in the manufacturing method for the polysilicon TFT array substrate according to the embodiment of the disclosed technology.

As shown in FIG. 3E, a layer of photoresist 56 is applied on the substrate having the foresaid structures. Next, an exposure process is performed using the HTM plate 60. In a region of the HTM plate 60 corresponding to a TFT, a portion corresponding to the gate electrode region is an opaque region 61, and a portion of the HTM plate 60 corresponding to the source and drain regions are semi-transparent regions 62.

Figure 3F:
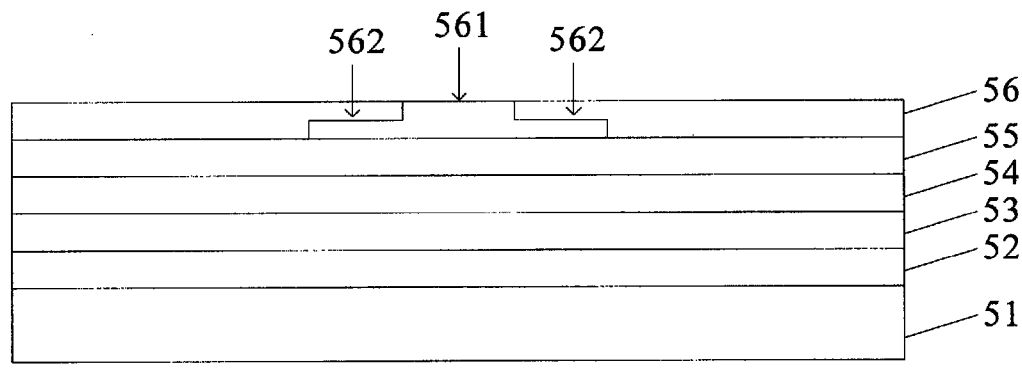
FIG. 3F is a sixth diagram in the manufacturing method for the polysilicon TFT array substrate according to the embodiment of the disclosed technology.

FIG. 3F is a diagram illustrating a state of the photoresist 56 after being exposed, where a region 561 of the photoresist 56 corresponds to the opaque region 61 of the HTM plate 60, and a region 562 of the photoresist 56 corresponds to the semi-transparent region 62 of the HTM plate 60.

Figure 3G:
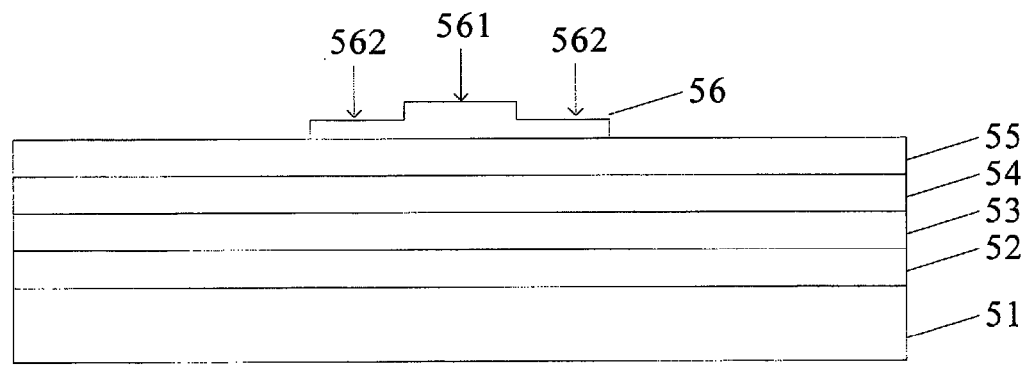
FIG. 3G is a seventh diagram in the manufacturing method for the polysilicon TFT array substrate according to the embodiment of the disclosed technology.

FIG. 3G is a diagram illustrating the state of the photoresist 56 after being developed, where the region 561 of the photoresist 56 is a photoresist-completely-remained region, and the region 562 of the photoresist 56 is a photoresist-partially-remained region, and other regions are a photoresist-completely-removed region.

Figure 3H:
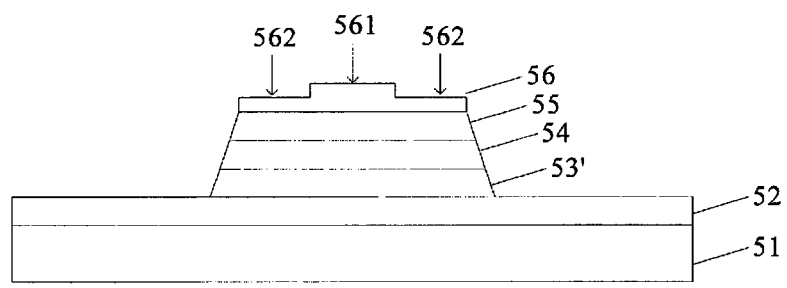
FIG. 3H is an eighth diagram in the manufacturing method for the polysilicon TFT array substrate according to the embodiment of the disclosed technology.

Next, as shown in FIG. 3H, the gate metal layer 55 in the photoresist-completely-removed region is wet etched, after which the gate insulating layer 54 and the polysilicon layer 53 in the photoresist-completely-removed region is dry etched. As a result, a polysilicon semiconductor pattern 53' is obtained.

Figure 3I:
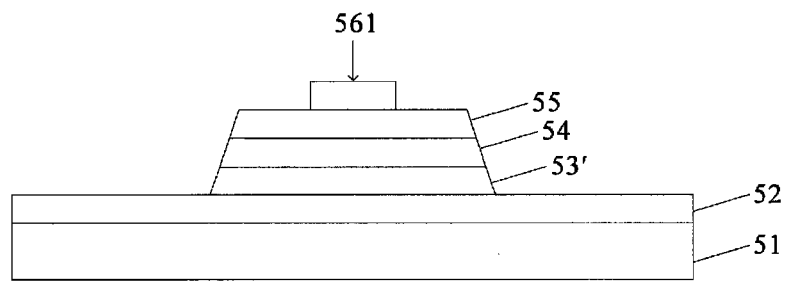
FIG. 3I is a ninth diagram in the manufacturing method for the polysilicon TFT array substrate according to the embodiment of the disclosed technology.

Next, the photoresist in the photoresist-partially-remained region is removed through a plasma ashing process, with a part of the photoresist in the photoresist-completely-remained region 561 remained, as shown in FIG. 3I. The photoresist-completely-remained region 561 corresponds to the gate electrode region.

Figure 3J:
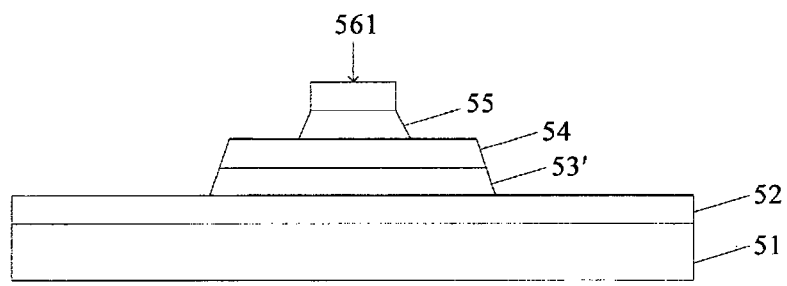
FIG. 3J is a tenth diagram in the manufacturing method for the polysilicon TFT array substrate according to the embodiment of the disclosed technology.

Next, as shown in FIG. 3J, the gate metal layer 55 in the photoresist-partially-remained region 562 is further etched through a wet etching process.

Figure 3K:
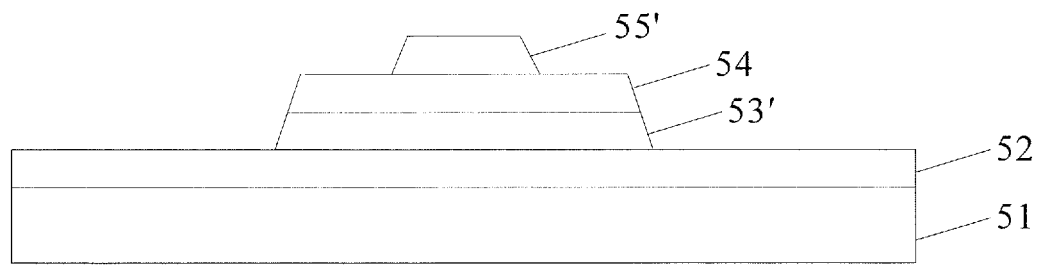
FIG. 3K is an eleventh diagram in the manufacturing method for the polysilicon TFT array substrate according to the embodiment of the disclosed technology.

As shown in FIG. 3K, a gate electrode 55' is obtained after the photoresist in the photoresist-completely-remained region is removed. As shown in FIG. 3K, a central part of the polysilicon semiconductor pattern 53' is covered by the gate electrode, and the polysilicon semiconductor pattern 53' has two parts, which are not covered by the gate electrode 55' at two sides of the gate electrode 55', for forming a source region and a drain region in later steps.

Up to this point, the present embodiment finishes the patterning of the gate electrode and the polysilicon semiconductor pattern through a single HTM process. Compared with that in the related arts, in which a polysilicon semiconductor pattern is obtained through a patterning process and a gate electrode is obtained through another patterning process, the present embodiment omits one process of exposing using a mask. As a result, the process complexity is decreased and processing time and processing cost is reduced.

During this step, compared with the related arts in which two mask processes are used for obtaining the polysilicon semiconductor pattern and the gate electrode, respectively, the polysilicon semiconductor pattern of the present embodiment is slightly enlarged in the plane size by about 0.5-1.0 μm, which effectively diminishes a possible effect on the property of the LTPS TFT as a result of reducing one mask-process.

Step S406, performing a p-type doping process on source and drain regions of the polysilicon semiconductor pattern.

Figure 3L:
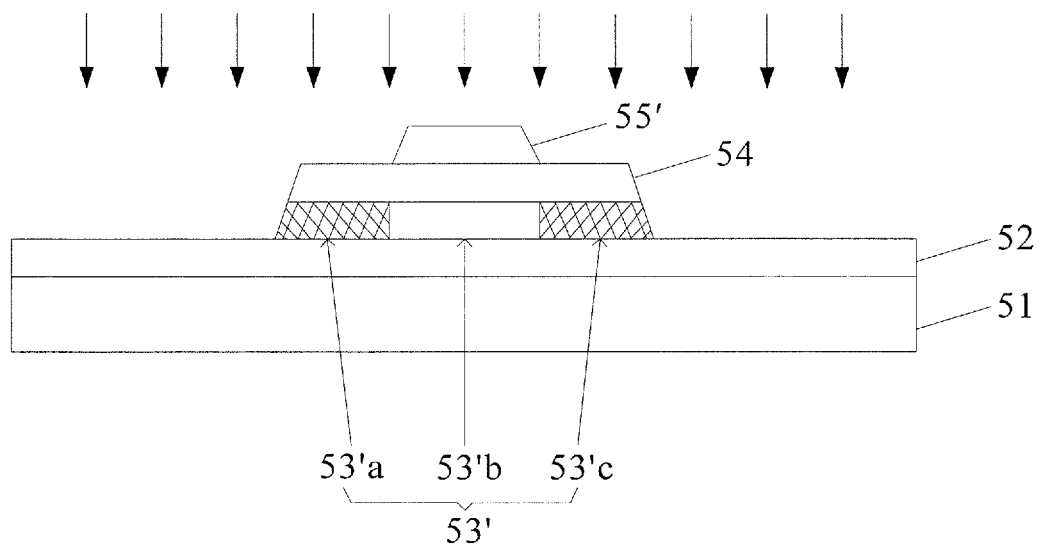
FIG. 3L is a twelfth diagram in the manufacturing method for the polysilicon TFT array substrate according to the embodiment of the disclosed technology.

As shown in FIG. 3L, $BH_x$ or $BF_3$ (e.g., a mixture of $B_2H_6$ or $BF_3$ with $H_2$, the mole percent of $B_2H_6$ or $BF_3$ is 5-10%) is doped into the source and drain regions using ion bath or ion implantation through a self-aligning process, with a doping dose of $1-8\times10^{15}$ cm$^{-2}$ and a doping energy of 5-100 KeV. Next, the doped ions are activated through a rapid thermal annealing (RTA) process. Meantime, the polysilicon semiconductor pattern is hydrogenated during the RTA activation process by making use of H contained in $SiN_x$ of the gate insulating layer. The hydrogenated polysilicon semiconductor pattern refers to the polysilicon semiconductor in total remained on the substrate, including the source and drain regions formed after the doping process. The fabricating steps of the whole process may be reduced through this method, for example, the subsequent $H_2$ plasma hydrogenating process is omitted. By the foresaid doping process, a source region 53'a, a drain region 53'b of the LTPS TFT are formed. Due to the presence of the gate electrode 55', dopant ions are not doped into a semiconductor layer between the source region 53'a and the drain region 53'c, which becomes a channel region 53'b. Although the present embodiment is described with a p-type doping as an example, the disclosed technology is not limited thereto. N-type doping can also be performed in the step with $P_2H_6$ (e.g., a mixture of $P_2H_6$ with $H_2$, the mole percent of $P_2H_6$ is 5-10%).

Step S407, forming an interlayer dielectric layer.

Figure 3M:
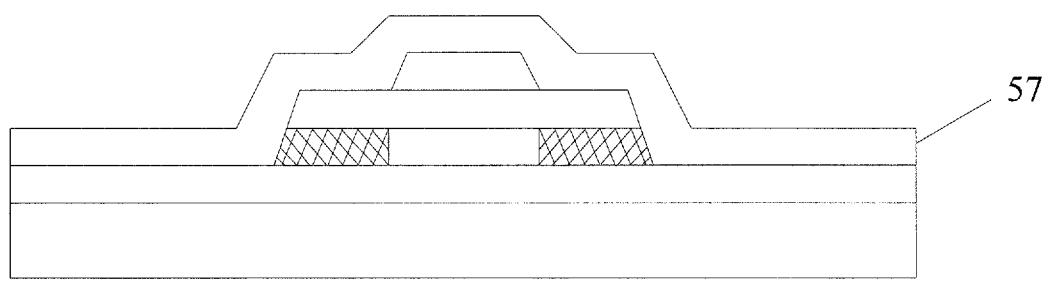
FIG. 3M is a thirteenth diagram in the manufacturing method for the polysilicon TFT array substrate according to the embodiment of the disclosed technology.

As shown in FIG. 3M, an interlayer dielectric layer 57 is formed through a PECVD method. The material for the interlayer dielectric 57 may be one selected from a group consisting of composite $SiO_2/SiN_x$, $SiN_x$, and $SiO_2$, with a thickness of 100-500 nm.

Step S408, forming a data line and a power supply line.

A metal layer of a data line and a power supply (VDD) line (not shown) is sputtered. The metal layer may be Mo, Al, Al—Mo or the like having a thickness of 300-400 nm. A second patterning process is performed on the metal layer to obtain the data line, the VDD line and the like.

Step S409, forming a passivation layer.

Figure 3N:
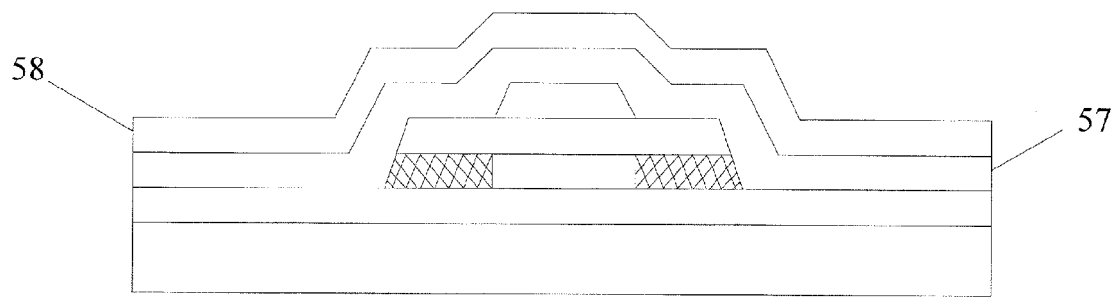
FIG. 3N is a fourteenth diagram in the manufacturing method for the polysilicon TFT array substrate according to the embodiment of the disclosed technology.

As shown in FIG. 3N, after the data line and the power supply line are formed, a passivation layer 58 having a thickness of 300-500 nm is formed through a PECVD process. The material for the passivation layer may be $SiN_x$ or organic coating.

Step S410, forming a via hole.

Figure 3O:
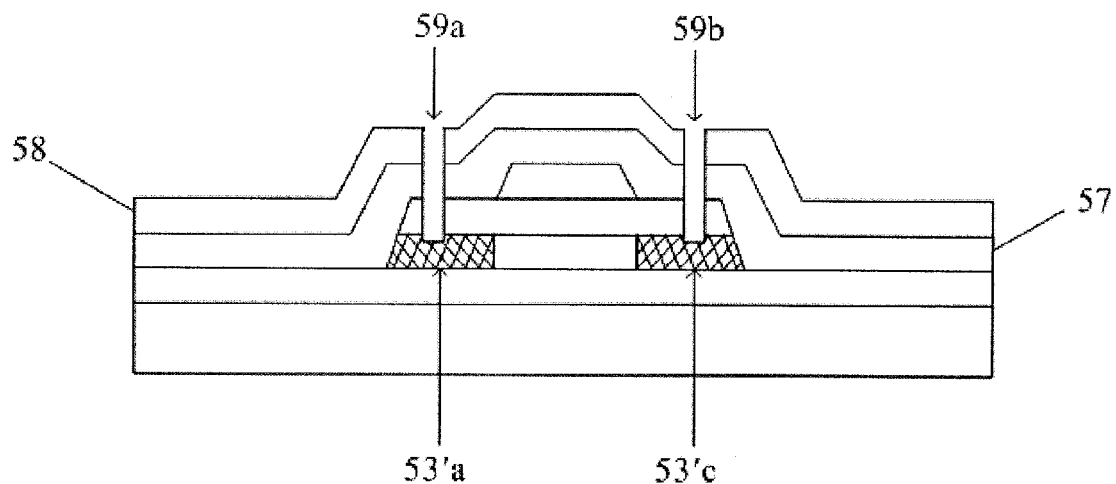
FIG. 3O is a fifteenth diagram in the manufacturing method for the polysilicon TFT array substrate according to the embodiment of the disclosed technology.

As shown in FIG. 3O, via holes are formed through a third patterning process. The via holes 59a and 59b expose the source and drain regions 53'a and 53'c of the TFT. In addition, though not shown in the drawings, the present step also forms a via hole at a position corresponding to the data line to expose the data line, so that the data line can be connected to the source region through subsequent steps.

Step S411, forming dual electrodes in the via holes and forming a pixel electrode.

Figure 3P:
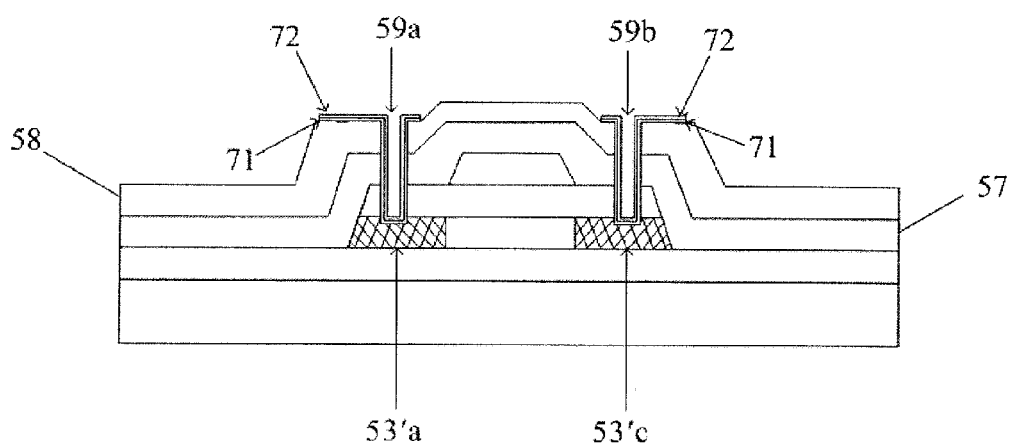
FIG. 3P is a sixteenth diagram in the manufacturing method for the polysilicon TFT array substrate according to the embodiment of the disclosed technology.

As shown in FIG. 3P, the substrate is cleaned after step S410 to remove surface particles and some organic remnants. An ultra-thin metal layer 71 and a transparent conductive layer 72 (e.g., an indium tin oxide (ITO) layer, or an indium zinc oxide (IZO) layer) are sequentially deposited in a dual electrode manner through a sputtering process, where the metal layer 71 may be a metal selected from a group consisting of Mo, Mo/Al—Nd/Mo, Ag, Al and the like, and may have a thickness of 1-20 nm. The transparent conductive layer 72 may have a thickness of 50-200 nm. Actually, the electrodes formed in the via holes over the source/drain regions serve as source and drain electrodes to electrically connecting the source/drain regions with the data line and the pixel electrode, respectively.

Alternatively, a single transparent conductive layer may be deposited in this step to form a single electrode and a pixel electrode. The transparent conductive layer may have a thickness of 50-200 nm.

At last, a fourth patterning process is performed to obtain a pixel electrode connected to the drain region through the via hole and make the data line be connected to the source region.

Here, a dual electrode is employed to decrease the resistance of the via hole connection line. If only a transparent conductive layer is used, the resistance of the connection line may be increased; thereby a display delay may be increased to affect the display quality of the panel.

Of course, a single transparent conductive layer may be used as a via hole connection line in a small-sized LTPS TFT-LCD. However, for a AMOLED (active matrix organic light emitting diode), a dual electrode is better be used to decrease the resistance of the via hole connection line.

In the manufacturing method for the LTPS TFT array substrate according to the present embodiment, after the polysilicon layer, the gate insulating layer and the gate metal layer are formed on a substrate, one patterning process is performed on the gate metal layer, the gate insulating layer and the polysilicon layer using a HTM plate, so as to obtain a gate electrode and a polysilicon semiconductor pattern in a single mask process. Compared with the related arts, in which a polysilicon semiconductor pattern is obtained through a patterning process and a gate electrode is obtained through another patterning process, the present embodiment omits one process of exposing using a mask. As a result, the process complexity is simplified and processing time and cost are reduced. In addition, the via hole through which the data line is connected with the source region and the via hole through which the pixel electrode is connected with the drain region are formed in the same patterning process, which also reduces the number of the patterning processes.

Second Embodiment

The second embodiment of the disclosed technology provides a manufacturing method for a low temperature polysilicon (LTPS) TFT array substrate, which is described by an example of manufacturing a LTPS TFT array substrate using a gray tone mask (GTM).

Figure 2B:
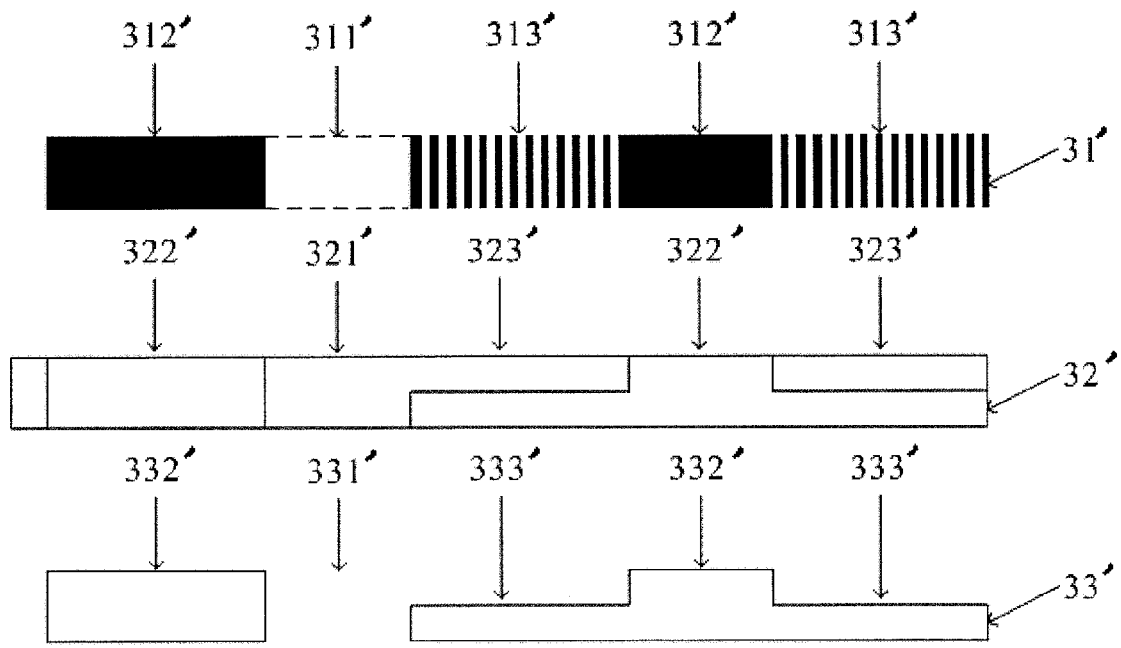
FIG. 2B is a diagram illustrating exposing photoresist with a grey tone mask (GTM) mask.

First, the main principle of the GTM process is described with reference to FIG. 2B. A GTM is a mask utilizing a grating effect to form various regions light through each of which has different intensities. Thus, it can be used to selectively expose and develop a photoresist layer. FIG. 2B shows an exposing process performed on the photoresist using a GTM plate 31'. The GTM plate 31' comprises a transparent region 311', an opaque region 312' and a semi-transparent region 313'. The photoresist 32' is in a state of having been exposed, where a region 321' corresponds to the transparent region 311' of the GTM plate 31', a region 322' corresponds to the opaque region 312' of the GTM plate 31', and a region 323' corresponds to the semi-transparent region 313' of the GTM plate 31'. The photoresist 33' is in a state of having been developed, where a region 331' corresponds to the transparent region 311' of the GTM plate 31', a region 332' corresponds to the opaque region 312' of the GTM plate 31', and a region 333' corresponds to the semi-transparent region 313' of the GTM plate 31'.

The present embodiment is substantially the same as the first embodiment except that a step of patterning using a GTM plate (here referred to step S605) is different from the step of patterning using a HTM plate (step S405) of the first embodiment.

The present embodiment comprises the following steps.

Step S601, forming a buffer layer on a substrate.

Step S602, forming a polysilicon layer on the buffer layer.

Step S603, forming a gate insulating layer on the polysilicon layer.

Step S604, forming a gate metal layer on the gate insulating layer.

Step S605, patterning the gate metal layer, the gate insulating layer and the polysilicon layer using a GTM plate to obtain a gate electrode and a polysilicon semiconductor pattern in a single patterning process.

A layer of photoresist is coated on the substrate formed after step S604. Next, an exposure process is performed on the substrate using a GTM plate. With respect to an area in the GTM plate corresponding to a TFT, a portion of the GTM plate corresponding to the gate electrode region is the opaque region, and a portion of the GTM plate corresponding to the source and drain regions is the semi-transparent region.

FIG. 3F (referring to related figure for the first embodiment, as the present embodiment is the same as the first embodiment in this regard) is a diagram illustrating the state of the photoresist 56 after being exposed in this step, where a region 561 of the photoresist 56 corresponds to the opaque region of the GTM plate, and a region 562 of the photoresist 56 corresponds to the semi-transparent region of the GTM plate.

FIG. 3G (referring to related figure for the first embodiment, as the present embodiment is the same as the first embodiment in this regard) is a diagram illustrating the state of the photoresist 56 after being developed, where the region 561 of the photoresist 56 is a photoresist-completely-remained region, and the region 562 of the photoresist 56 is a photoresist-partially-remained region, and other regions are a photoresist-completely-removed region.

Next, as shown in FIG. 3H (referring to related figure for the first embodiment, as the present embodiment is the same as the first embodiment in this regard), the gate metal layer 55 in the photoresist-completely-removed region is wet etched, after which the gate insulating layer 54 and the polysilicon layer 53 in the photoresist-completely-removed region is dry etched. As a result, a polysilicon semiconductor pattern 53' is obtained.

Next, the photoresist in the photoresist-partially-remained region is removed through a plasma ashing process, with a part of the photoresist in the photoresist-completely-remained region 561 remained, as shown in FIG. 3I (referring to related figure for the first embodiment, as the present embodiment is the same as the first embodiment in this regard). The photoresist-completely-remained region 561 corresponds to the gate electrode region.

Next, as shown in FIG. 3J (referring to related figure for the first embodiment, as the present embodiment is the same as the first embodiment in this regard), the gate metal layer 55 in the photoresist-partially-remained region 562 is further etched through a wet etching process.

As shown in FIG. 3K (referring to related figure for the first embodiment, as the present embodiment is the same as the first embodiment in this regard), a gate electrode 55' is obtained after the photoresist in the photoresist-completely-remained region is removed.

Up to this point, the present embodiment finishes the patterning of the gate electrode and the polysilicon semiconductor pattern through a single GTM process. Compared with the related arts, in which a polysilicon semiconductor part is obtained through a patterning process and a gate electrode is obtained through another patterning process, the present embodiment omits one process of exposing using a mask. As a result, the process complexity is decreased and processing time and processing cost is reduced.

During this step, compared with the related arts in which two mask processes are used for obtaining the polysilicon semiconductor part and the gate electrode, respectively, the polysilicon semiconductor pattern of the present embodiment is slightly enlarged in the plane size by about 0.5-1.0 μm, which effectively diminishes a possible effect on the property of the LTPS TFT due to reducing one mask process.

Step S606, performing a p-type doping process on source and drain regions of the polysilicon semiconductor pattern.

Step S607, forming an interlayer dielectric layer.

Step S608, forming a data line and a power supply line.

Step S609, forming a passivation layer.

Step S610, forming via holes.

Step S611, forming dual electrodes (e.g., being made of a metal layer and a transparent conductive layer such as ITO or IZO) in the via holes and forming a pixel electrode. Alternatively, a single transparent conductive layer may be deposited in this step to form a single electrode and a pixel electrode.

In the manufacturing method for the LIPS TFT array substrate according to the present embodiment, after the polysilicon layer, the gate insulating layer and the gate metal layer are formed on a substrate, a patterning process is performed on the gate metal layer, the gate insulating layer and the polysilicon layer using a GTM plate, so as to obtain a gate electrode and a polysilicon semiconductor pattern in a single patterning process. Compared with the related arts, in which a polysilicon semiconductor pattern is obtained through a patterning and a gate electrode is obtained through another patterning, the present embodiment omits one process of exposing using a mask. As a result, the process complexity is simplified and processing time and cost are reduced. In addition, the via hole through which the data line is connected with the source region and the via hole through which the pixel electrode is connected with the drain region are formed in the same patterning process, which also reduces the number of the patterning processes.

It should be noted that the above embodiments only have the purpose of illustrating the disclosed technology, but not limiting it. Although the disclosed technology has been described with reference to the above embodiment, those skilled in the art should understand that modifications or alternations can be made to the solution or the technical feature in the described embodiments without departing from the spirit and scope of the disclosed technology.

What is claimed is:

1. A manufacturing method for a low temperature polysilicon (LTPS) thin film transistor (TFT) array substrate, comprising:
    forming a polysilicon layer on a substrate;
    forming a gate insulating layer on the polysilicon layer;
    forming a gate metal layer on the gate insulating layer; and
    patterning the gate metal layer, the gate insulating layer and the polysilicon layer by using a half tone mask (HTM) or a gray tone mask (GTM) so as to obtain a gate electrode and a polysilicon semiconductor pattern in a single mask process, wherein a central part of the polysilicon semiconductor pattern is covered by the gate electrode, and the polysilicon semiconductor pattern has two parts, which are not covered by the gate electrode at two sides of the gate electrode, for forming a source region and a drain region.

2. The manufacturing method of claim 1, wherein patterning the gate metal layer, the gate insulating layer and the polysilicon layer comprising:
    applying a layer of photoresist on the gate metal layer;
    exposing the photoresist by using the half tone mask or the grey tone mask, forming a photoresist-completely-remained region, a photoresist-partially-remained region, and a photoresist-completely-removed region after development, wherein the photoresist-completely-remained region corresponds to a region for the gate electrode, and the photoresist-partially-remained region corresponds to the source/drain regions;
    removing the gate metal layer, the gate insulating layer and the polysilicon layer in the photoresist-completely-removed region by using an etching process;
    removing the photoresist in the photoresist-partially-remained region through an ashing process;
    removing the gate metal layer in the photoresist-partially-remained region by using an etching process; and
    removing the photoresist in the photoresist-completely-remained region.

3. The manufacturing method of claim 1, wherein the polysilicon semiconductor pattern has a thickness of 30-100 nm.

4. The manufacturing method of claim 1, further comprising:
    performing a doping process on the parts of the polysilicon semiconductor pattern not covered by the gate electrode by using the gate electrode as a mask, and a part of the polysilicon semiconductor pattern, which is covered by the gate electrode between the source region and the drain region without being doped, forms a channel.

5. The manufacturing method of claim 4, wherein the doping process is a p-type doping process.

6. The manufacturing method of claim 5, wherein the doping process comprising:
    doping $BH_x$ into the regions for the source and drain regions by using an ion bath or ion implantation through a self-aligning process; and
    activating the doped ions through a rapid thermal annealing (RTA) process, during which the polysilicon semiconductor pattern is hydrogenated simultaneously.

7. The manufacturing method of claim 4, further comprising:
   after the doping process, forming a data line and a power supply line on the substrate;
   forming a passivation layer,
   forming via holes over the source and drain regions of the polysilicon semiconductor pattern; and
   depositing a transparent conductive layer a part of which is filled in the via holes.

8. The manufacturing method of claim 7, wherein the transparent conductive layer has a thickness of 50-200 nm.

9. The manufacturing method of claim 7, further comprising:
   before forming the transparent conductive layer, depositing a layer of metal thin film in the via holes.

10. The manufacturing method of claim 9, wherein the metal thin film has a thickness of 1-20 nm, and the transparent conductive layer has a thickness of 50-200 nm.

11. The manufacturing method of claim 9, wherein the metal thin film is a material selected from a group consisting of Mo, Mo/Al—Nd/Mo, Ag and Al.

12. The manufacturing method of claim 7, further comprising:
   simultaneously with forming the via holes over the source and drain regions, forming a via hole over the data line so as to expose a part of the data line, the data line is electrically connected with the source region through the via hole over the data line and the via hole over the source region.

13. The manufacturing method of claim 1, wherein the step of forming the polysilicon layer comprising:
   forming an amorphous silicon layer on the substrate; and
   crystallizing the amorphous silicon layer so as to form the polysilicon layer.

* * * * *